United States Patent
Wang et al.

(10) Patent No.: US 11,566,096 B2
(45) Date of Patent: Jan. 31, 2023

(54) PROCESS FOR HIERARCHICAL MANIPULATION OF SELF-ASSEMBLED POLYMER THIN FILM PATTERNS THROUGH IN-FILM POLYMERIZATION

(71) Applicant: Northwestern University, Evanston, IL (US)

(72) Inventors: Muzhou Wang, Wilmette, IL (US); Zhe Qiang, Chicago, IL (US)

(73) Assignee: Northwestern University, Evanston, IL (US)

( * ) Notice: Subject to any disclaimer, the term of this patent is extended or adjusted under 35 U.S.C. 154(b) by 360 days.

(21) Appl. No.: 16/759,998

(22) PCT Filed: Nov. 1, 2018

(86) PCT No.: PCT/US2018/058694
§ 371 (c)(1),
(2) Date: Apr. 28, 2020

(87) PCT Pub. No.: WO2019/089915
PCT Pub. Date: May 9, 2019

(65) Prior Publication Data
US 2020/0283559 A1 Sep. 10, 2020

Related U.S. Application Data

(60) Provisional application No. 62/580,592, filed on Nov. 2, 2017.

(51) Int. Cl.
*C08F 293/00* (2006.01)
*C09D 153/00* (2006.01)

(52) U.S. Cl.
CPC ........ *C08F 293/00* (2013.01); *C09D 153/005* (2013.01)

(58) Field of Classification Search
CPC . C09D 153/005; C09D 153/02; G03F 7/0002; C08F 293/00; B82Y 40/00
See application file for complete search history.

(56) References Cited

U.S. PATENT DOCUMENTS

| | | |
|---|---|---|
| 5,013,338 A | 5/1991 | Anand et al. |
| 8,309,278 B2 | 11/2012 | Yang et al. |
| 8,966,411 B2 | 2/2015 | Chang et al. |
| 2002/0001775 A1 | 1/2002 | Knoll |
| 2008/0299353 A1 | 12/2008 | Stoykovich et al. |
| 2011/0206905 A1 | 8/2011 | Buriak et al. |
| 2013/0189504 A1 | 7/2013 | Nealy et al. |
| 2014/0228463 A1 | 8/2014 | Gupta et al. |

FOREIGN PATENT DOCUMENTS

WO WO 89/00593 * 1/1989

OTHER PUBLICATIONS

Qiang et al., "Simultaneous in-film polymer synthesis and self-assembly for hierarchical nanopatterns," Department of Chemical and Biological Engineering, Northwestern University, Evanston, IL, ACS Macro Letters, 2018—ACS Publications, 7 pages.
Stein et al., "Selective directed self-assembly of coexisting morphologies using block copolymer blends," Nature Communications, Aug. 2, 2016, 7 pages.
Daga et al., "Photoinduced Ordering of Block Copolymers," ACS Publications, Nano Lett. 2011, 11, pp. 1153-1160.
Woo et al., "Three-Dimensional Multilayered Nanostructures from Crosslinkable Block Copolymers," ACS Macro Lett. 2016, 5, 287-291.
Alf et al., "Chemical Vapor Deposition of Conformal, Functional and Responsive Polymer Films," Adv. Mater. 2010, 22, 1993, 2027.
Chen et al., "Living Additive Manufacturing: Transformation of Parent Gels into Diversely Functionalized Daughter Gels Made Possible by Visible Light Photoredox Catalysis," ACS Cent. Sci. 2017, 3, 124-134.
Lane et al., "Photopatterning of Block Copolymer Thin Films," ACS Macro Lett. 2016, 5, 460-565.
Onses, M. Serdar, et al. "Hierarchical patterns of three-dimensional block-copolymer films formed by electrohydrodynamic jet printing and self-assembly." Nature nanotechnology 8.9 (2013): 667-675.
Park, Sungjune, et al. "Hierarchical manipulation of block copolymer patterns on 3D topographic substrates: beyond graphoepitaxy." Advanced Materials 28.32 (2016): 6900-6905.
Bates, Christopher M., et al. "Block copolymer lithography." Macromolecules 47.1 (2014): 2-12.
Ruiz, Ricardo, et al. "Density multiplication and improved lithography by directed block copolymer assembly." Science 321.5891 (2008): 936-939.
Bita, Ion, et al. "Graphoepitaxy of self-assembled block copolymers on two-dimensional periodic patterned templates." Science 321. 5891 (2008): 939-943.
Bosworth, Joan K., Charles T. Black, and Christopher K. Ober. "Selective area control of self-assembled pattern architecture using a lithographically patternable block copolymer." ACS nano 3.7 (2009): 1761-1766.
International Search Report and Written Opinion for PCT/US18/58694, dated Jan. 16, 2019.

* cited by examiner

*Primary Examiner* — Jeffrey C Mullis
(74) *Attorney, Agent, or Firm* — Bell & Manning, LLC (57) ABSTRACT

Methods for the in-film polymerization of a second polymer in a film of a first polymer are provided. The methods integrate polymer synthesis with simultaneous block copolymer selfassembly, providing a route for on-demand nanopattern manipulation in polymeric films.

22 Claims, 12 Drawing Sheets

PROCESS FOR HIERARCHICAL MANIPULATION OF SELF-ASSEMBLED POLYMER THIN FILM PATTERNS THROUGH IN-FILM POLYMERIZATION

CROSS-REFERENCE TO RELATED APPLICATIONS

This application is a National Stage of International Application No. PCT/US18/58694, filed Nov. 1, 2018, which claims the benefit of U.S. Patent Application No. 62/580,592, filed Nov. 2, 2017, the contents of which are herein incorporated by reference.

BACKGROUND

Many applications require the assembly of block copolymers (BCPs) in thin films with different regions containing different features (domain spacing and morphology). To attain this control, post-treatment processes have been developed, including kinetically trapping a non-equilibrium state during annealing; controlling air-polymer interfacial energies through top-coating; and adjusting the copolymer interaction parameter through a photoacid generator. These are often combined with either "bottom-up" (substrate modification) or "top-down" (lithography) techniques for locally controlling the morphology. However, these methods usually only lead to an orientation switch, an order-disorder transition, or a limited size variation of nanostructures, since the equilibrium morphology of each region is ultimately controlled by its underlying BCP. Alternatively, multi-step film casting/deposition, crosslinking and etching could generate deterministically defined hierarchical structures with multiple length scales from centimeters down to ~10 nm, but these methods become more limited with increasing complexity of the final patterns, as one BCP only corresponds to one certain size and morphology.

SUMMARY

Methods of forming and altering the properties of polymer films are provided. One embodiment of such methods includes exposing a polymer film comprising a first polymer to a vapor comprising a polymerizable monomer, wherein the polymerizable monomer diffuses into, and swells, the polymer film; and polymerizing the polymerizable monomers into a second polymer within the polymer film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 8A-8I show Atomic Force Microscopy (AFM) images of SIS-71 films after photopolymerization in presence of styrene with homo-polystyrene contents of (8A) 0 vol %, (8B) 7 vol %, (8C) 19 vol %, and (8D) 27 vol % in the film. SIS-84 films also underwent photopolymerization in the presence of isoprene, with (8E) 0 vol %, (8F) 6 vol %, (8G) 12 vol %, and (8H) 14 vol % final homo-polyisoprene content. UV power intensity was 0.5 mW/cm$^2$.

FIGS. 9A-9F. AFM images of a SIS-84 film after in-film photopolymerization of styrene monomers using a vapor at $p/p_0=0.85$ for 1 h with a UV intensity of (9A) 0.5 mW/cm$^2$, (9B) 0.4 mW/cm$^2$, (9C) 0.32 mW/cm$^2$, and (9D) 0.25 mW/cm$^2$, with a scale bar of 500 nm.

DETAILED DESCRIPTION

Methods for the in-film polymerization of a second polymer in a film of a first polymer are provided. Both the first and second polymers can be homopolymers or copolymers. The methods integrate polymer synthesis with simultaneous BCP self-assembly, providing a route for on-demand nanopattern manipulation.

The methods enable the hierarchical manipulation of nanopatterns in polymer thin films by changing their underlying chemistry. Changes in the thin films that can be controlled by the methods include changes in the morphology (shape), size, and/or spacing of the domains within the polymer film. As the change of a polymer's nanostructure is guided by its equilibrium state, the methods can be applied to any polymer system and combined with any other state-of-the-art technique for defect annihilation and alignment control, such as the applications of epitaxy and external fields.

In the methods, the polymerization of the second polymer takes place within the film of the first polymer when the polymer film is exposed to a vapor containing one or more monomers that form the second polymer upon polymerization. The in-film polymerization of the second polymer can take place with or without the use of a polymerization initiator, depending on the monomers used.

In some embodiments of the methods, a radical initiator is embedded in a polymer film and the polymerization of the second polymer takes place within the radical initiator-embedded polymer. These methods entail forming a film of a first polymer having at least one radical initiator embedded in it. The initiators can be embedded in a polymer film by, for example, dissolving the first polymer and the initiator in a solvent, applying the solution as a coating on a substrate surface, and allowing the volatile components of the solution, such as organic solvents, to evaporate. Suitable coating methods include spin casting, dip coating, and spraying. However, other coating methods can be used. Alternatively, the polymer film can be formed and then exposed to a vapor containing a radical initiator, which diffuses into the film.

If a radical initiator is used, the radical initiator is activated via exposure to an external stimulus, such as radiation, heat, an electron beam, or a combination thereof. Thus, the radical initiator may be a photoinitiator, a thermal initiator, or a combination thereof. That is, the initiator may be the type that generates reactive free radicals in response to radiation or heat. Examples of radical initiators include small molecule UV photoinitiators, such as phosphine oxide initiators, including mono acyl phosphines and bi acyl phosphines (e.g., diphenyl(2,4,6-trimethylbenzoyl) phosphine oxide (TPO) and bis(diethylamino)benzophenone). In some embodiments, the concentration of radical initiator in the film of the first polymer is in the range from about 0.5 wt. % to about 6 wt. %, including in the range from about 1 wt. % to about 5 wt. %, based on the total weight of the polymer and the radical initiator.

The in-film polymerization of the second polymer is carried out by exposing the original polymer film to a vapor comprising polymerizable monomers under conditions (e.g., times and temperatures) at which the polymerizable monomers polymerize to form the second polymer within the film. In this process, the polymerizable monomer diffuses into, and swells, the film of the first polymer. Generally, the monomer will selectively swell the polymer block having more similar chemistry. Swelling the polymer film with a monomer from the vapor provides sufficient mobility to enable photopolymerization with simultaneous chain arrangement to allow for the re-ordering of self-assembled domains within the films. Optionally, a radical initiator can be included in the vapor along with the polymerizable monomers. If a radical initiator is used, the film may be irradiated and/or heated to induce the polymerization of the monomers. In this process, the radiation (for example, UV radiation) and/or heat generates radicals from the radical initiator, thereby activating the initiator, which initiates the polymerization of the second polymer within the polymer film.

As used herein, the term monomer includes conventional monomers, but also short oligomers that are able to be vaporized and to diffuse into the film and polymerize into larger polymers within the polymer film. The extent of the polymerization can be controlled by the concentration of the monomer concentration in the vapor and the film. If a polymerization initiator is used, the extent of polymerization can also be controlled by the concentration of polymerization initiator and the duration and energy or intensity of the initiating radiation and/or heat. The vapor comprising the polymerizable monomer may contain only a single type of monomer, such that a homopolymer of that monomer is polymerized within the original polymer film. However, the vapor may also contain two or more different types of monomers, such that a copolymer is polymerized from those monomers within the original polymer film.

In some embodiments of the methods, the first polymer is a block copolymer comprising a first polymer block and a second polymer block, wherein the polymer blocks are self-assembled into at least two different domains. When the first polymer is a self-assembled block copolymer, the formation of the second polymer within the polymer film can be used to alter the size, shape, and/or orientation of one or more of the domains in the self-assembled film.

In some embodiments, the block copolymer is self-assembled into a first domain comprised of a first plurality of lamellae and a second domain comprised of a second plurality of lamellae. The lamellae may be oriented vertically with respect to the substrate surface, but may also be oriented horizontally with respect to the substrate surface, such that the lamellae are stacked as sheets on the substrate. In other embodiments, the first domain is comprised of a plurality of vertical cylinders and the second domain is comprised of a polymer matrix that surrounds the cylinders within the plurality of vertical cylinders. In still other embodiments, the first domain comprises a plurality of horizontal cylinders and the second domain comprises a polymer matrix that surrounds the cylinders in the plurality of horizontal cylinders. As used herein, the terms vertical and horizontal refer to the orientation of the cylinders with respect to the surface of the substrate upon which the block copolymer film is disposed. In yet other embodiments, the first domain comprises a plurality of spheres and the second domain comprises a polymer matrix that surrounds the spheres in the plurality of spheres. The substrate may be a patterned substrate that dictates the initial domain morphology of the polymer film. The substrate patterns may be composed of topological elements (e.g., as in graphoepitaxy) or areas having different surface properties (e.g., as in chemoepitaxy).

The domains in the self-assembled films may form patterns on the surfaces of the films and these patterns may have one or more nanoscale dimensions. As used herein, the term nanoscale dimension refers to a dimension (e.g., length, width, height, and/or diameter) that is no greater than about 1000 nm. This includes dimensions of no greater than 500 nm, no greater than 100 nm, and no greater than 10 nm. However, patterns having larger dimensions can also be formed. As one of ordinary skill in the art understands, the particular pattern formed by a block copolymer and the dimensions of that pattern can be controlled by the appropriate selection of the polymer blocks and the material of the substrate upon which the block copolymer film is formed. By way of illustration, for a block copolymer in which the first and second domains comprise lamellar domains, the lamellae of the first domain and the lamellae of the second domains may be arranged in an alternating sequence on a substrate to form a striped pattern or a finger-print like pattern. Alternatively, for a block copolymer in which the first domain comprises a plurality of vertical cylinders and the second domain comprises a polymer matrix that surrounds the cylinders laterally, the vertical cylinders form a pattern of circles (or dots) in the matrix of the second polymer block.

Examples of block copolymers that can be used to form a film of a first polymer include polystyrene-b-polyisoprene-b-polystyrene (SIS), polystyrene-b-polybutadiene-b-polystyrene, block copolymers of styrene (S) and methyl methacrylate (MMA), and block copolymers of styrene (S) and vinyl pyridine (VP). However, other free-radical polymerizable monomers can be used. The monomers in the vapor that are used to form the second polymer within the first polymer can be the same as, or different from, one or more of the monomers from which the first polymer formed. By way of illustration, a vapor of polyisoprene can be used to form a polyisoprene homopolymer within a block copolymer film of SIS. In certain embodiments, the SIS BCP has a styrene volume fraction in the range from about 65% to about 90%.

In some embodiments of the methods, the second polymer is polymerized in only a portion of the film of the first polymer. This can be accomplished, for example, by exposing only a portion of the polymer film to the vapor containing the polymerizable monomers and/or by exposing only a portion of the polymer film to a polymerization-inducting stimulus. The selective exposure can be carried out using a mask or a focused beam of radiation. The portion of the film in which the second polymer is polymerized may be continuous or discontinuous and may form a regular or irregular pattern. The ability to form the second polymer in only a portion of the film is advantageous because it allows for the fabrication of a film in which different portions have different polymer domain shapes, sizes, and/or orientations. As a result, a complex pattern of domain morphologies can be generated in a single polymer film without the need for multiple-step deposition of different polymers on a substrate.

Figure 1A:
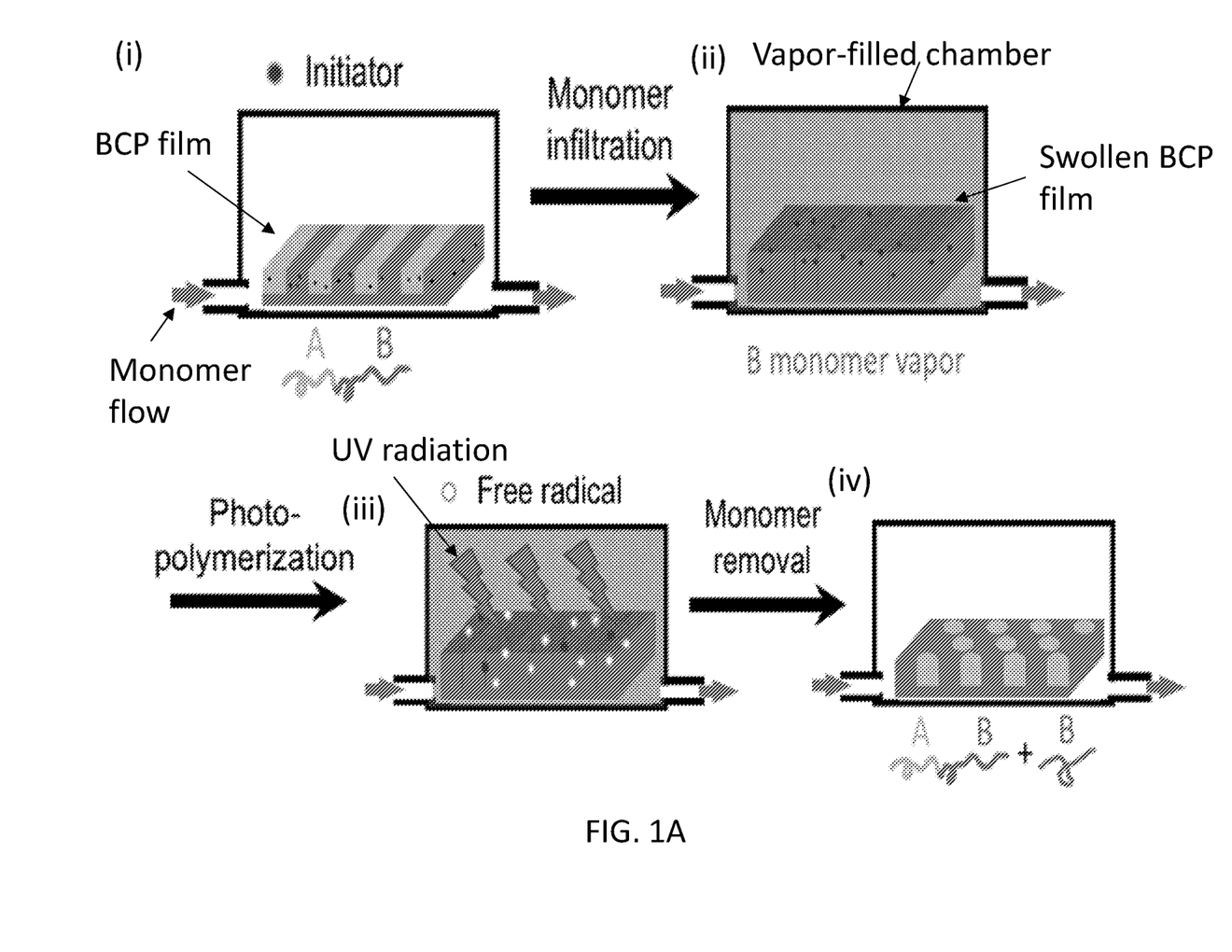
FIG. 1A. A universal schematic of an in-film photopolymerization process conducted in the presence of a "B monomer" vapor in a self-assembled A-B diblock copolymer thin film, resulting in a blended film composed of an A-B diblock copolymer and B homopolymer. The B monomer vapor is constantly fed into the chamber and swells the thin film during in-film polymerization.
Figure 1B:
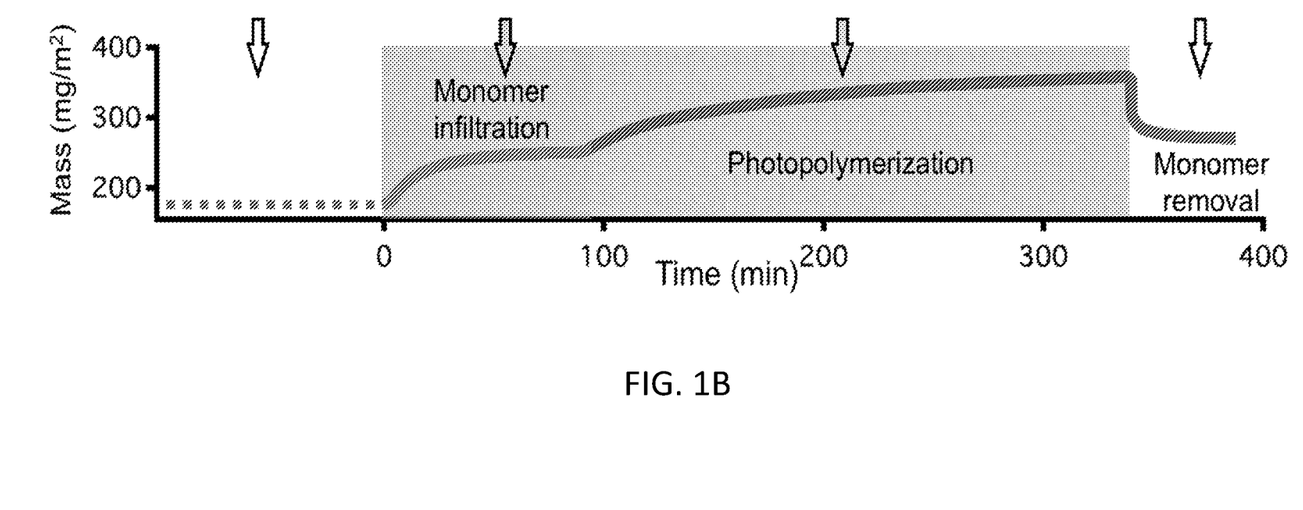
FIG. 1B. The mass of the SIS-71 film changes during the entire in-film photopolymerization process.

One embodiment of a method for the in-film polymerization of a polymer within an existing polymer film is illustrated in FIG. 1A. As shown in the figure, beginning with an initiator-embedded BCP film comprising perpendicular lamellae in a chamber (panel (i)), the method involves three steps: (1) a polymerizable monomer is introduced in the vapor phase into the chamber, where the monomers are taken up by and swell the film (panel (ii)); (2) during constant monomer vapor feeding, the swollen film is then irradiated with ultraviolet (UV) light (or other initiator-activating stimulus), causing the initiator species embedding in the film to generate free radicals that initiate polymerization of the monomers in the film, resulting in a change in the domain morphology to vertical cylinders (panel (iii)); and (3) the reaction is terminated when the radical species are completely consumed or the radiation (or other stimulus) and/or monomer vapor is removed (panel (iv)). Following the cessation of the stimulus, the film can be dried by replacing the monomer vapor in the sample chamber with dry $N_2$. The reaction produces homopolymers in the film via a stimulus-controlled process that alters the morphology the self-assembled domains by annealing the film in the monomer vapor. Optionally, the films can undergo post-anneal processing, such as shear aligning, to improve the ordering of the domains in the BCP.

EXAMPLES

Example 1: In-Film Photopolymerization of Polyisoprene in an SIS BCP

Figure 2A:
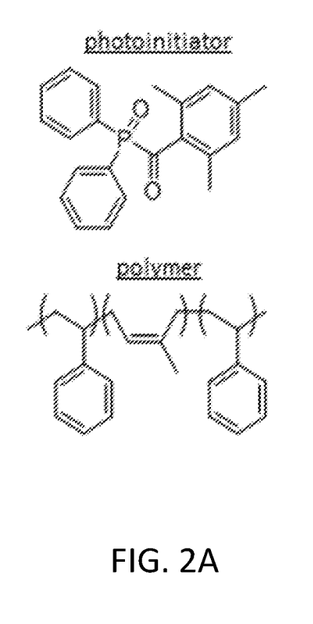
FIG. 2A. The structure of a diphenyl(2,4,6-trimethylbenzoyl)phosphine oxide photoinitiator (top) and a polystyrene-b-polyisoprene-b-polystyrene BCP (bottom).
Figure 2B:
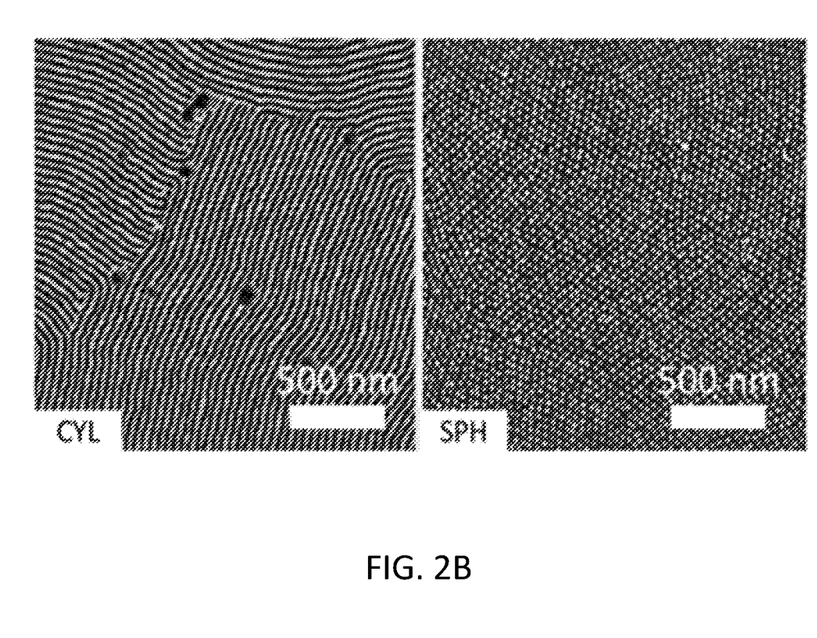
FIG. 2B shows atomic force micrographs of the BCP film before and after photopolymerization of isoprene, introduced in the vapor phase. The morphology changes from cylindrical to spherical.

This example demonstrates the in situ polymerization of a homopolymer of polyisoprene in a film of the model block copolymer system polystyrene-b-polyisoprene-b-polystyrene (SIS, 16 vol % styrene content) containing 2.4 wt. % photoinitiator, as shown in FIG. 2A. Upon UV irradiation in the presence of isoprene vapor, the film thickness increased from 158 nm to 175 nm over 1 hr. This approximately 11% film thickness increase is attributed to the addition of homopolymer from photopolymerization of the isoprene monomer in the swollen SIS film. The resulting polyisoprene from the in-film polymerization blended with the SIS copolymer, increasing the isoprene content and changing the equilibrium nanostructure of the film. FIG. 2B shows the evolution of the SIS film surface morphology, indicating a transition from styrene cylinders in an isoprene matrix before polymerization, into a spherical nanostructure when isoprene moves further into the majority.

Figure 3:
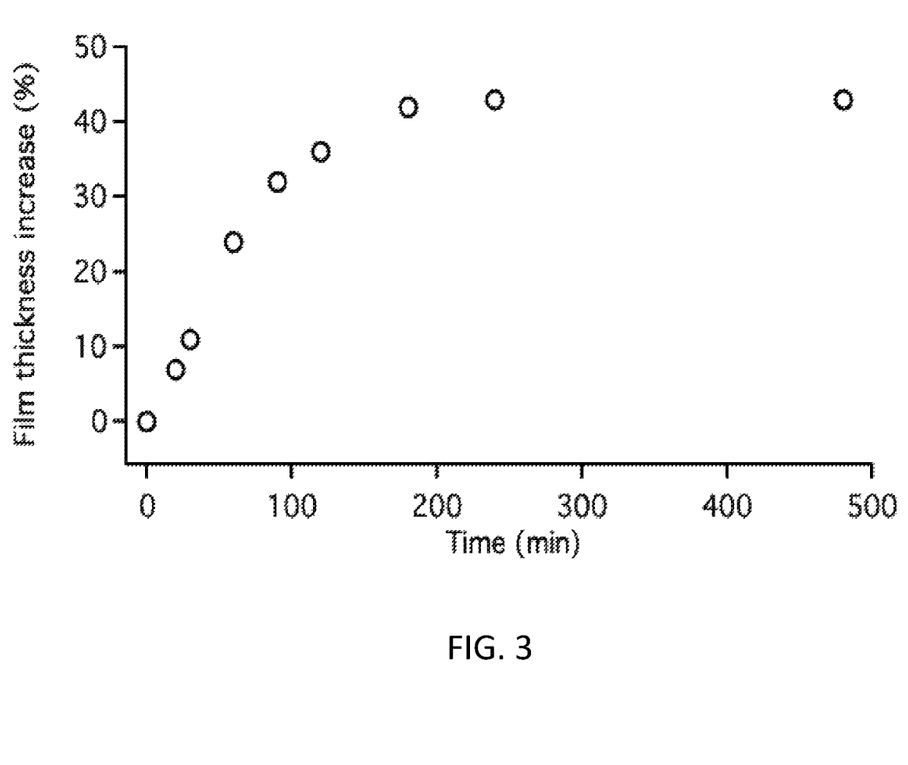
FIG. 3 is a graph showing the thickness of an SIS film (SIS-84) increasing with polymerization time.

The amount of homopolymers produced in the block copolymer films using this technique can be controlled by the polymerization time. FIG. 3 indicates that the film thickness increases as a function of reaction time, and this growth in the film thickness implies the amount of homopolymers synthesized within the film. The film thickness can increase up to 45% over an hour before the initiators are consumed. That this in-film polymerization can be obtained using this methodology is also confirmed by in situ quartz crystal microbalance (QCM), where the mass change in the polymer film is monitored in real time with the reaction progressing under different processing stages. For a 158-nm-thick SIS polymer film on the quartz crystal, gains in mass were clearly detected when styrene vapor was introduced into the reaction chamber, which leveled off to an equilibrium value as the swollen film was saturated. The UV light was switched on as the styrene vapor flow was maintained, which caused further mass gain as the polymerization reaction consumed the monomer and more monomer vapor swelled the film.

Figure 4:
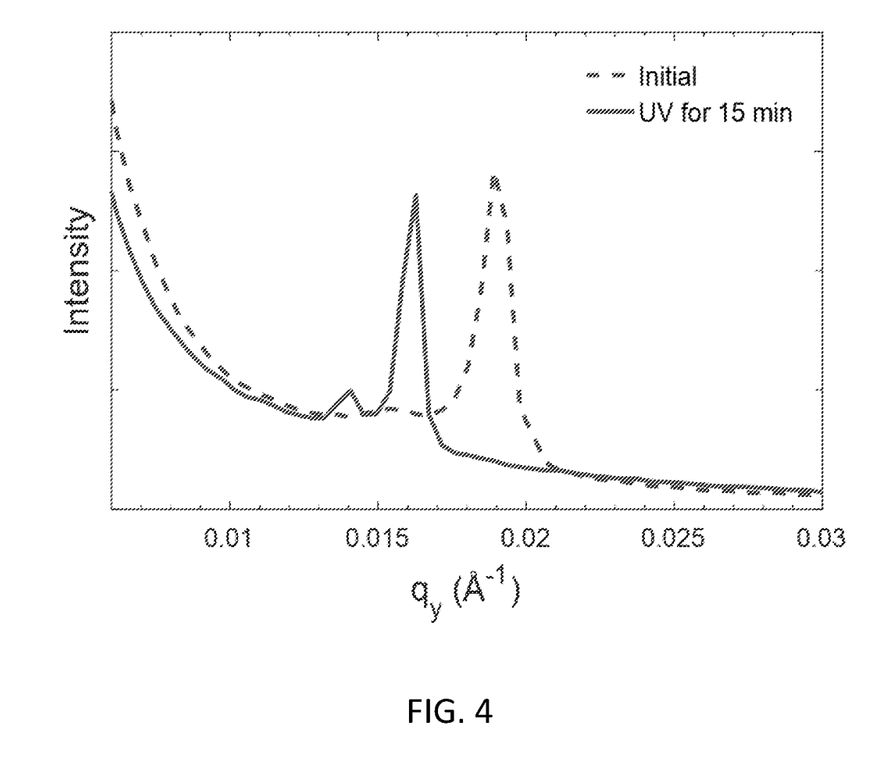
FIG. 4 shows line cuts of in-situ GISAXS data of SIS film undergoing ultraviolet (UV) irradiation in the presence of styrene vapor.

FIG. 4 shows line cuts of in-situ GISAXS data of SIS film undergoing UV irradiation in the presence of styrene vapor.

Beyond tuning the shapes of the nanopatterns (e.g., from cylinder to sphere) from self-assembled block copolymer thin films, this method was also found to lead to a change in domain size by controlling the polymerization time or irradiation energy. For example, preliminary results indicated that the domain spacing of the SIS film increased from 33.2 nm to 38.6 nm after UV irradiation for 15 min with styrene monomer vapor.

Figure 5A:
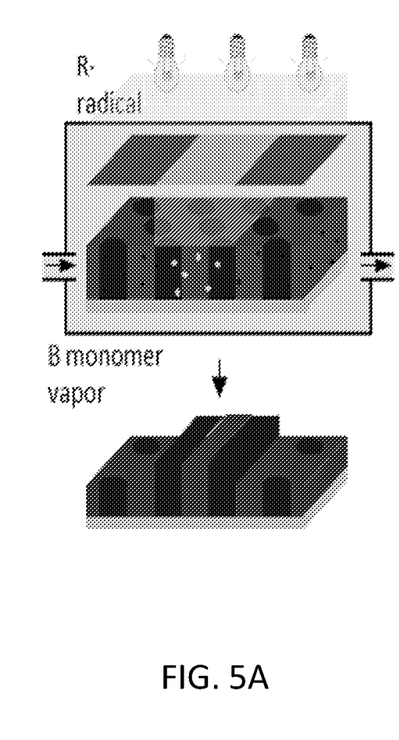
FIG. 5A illustrates how a photomask can enable local control of a polymerization reaction in a self-assembled BCP films.
Figure 5B:
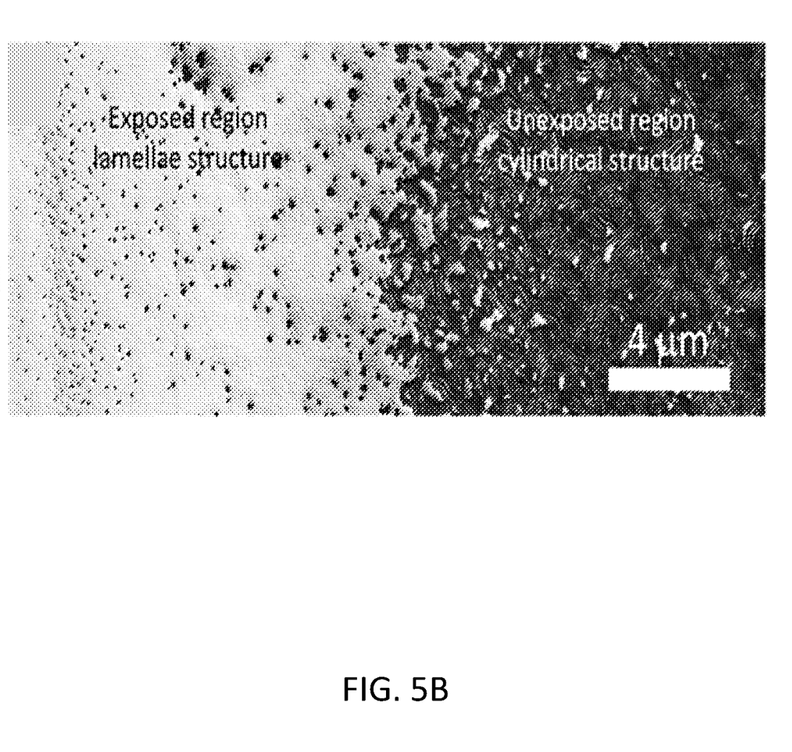
FIG. 5B shows that the local BCP nanostructure can be altered with exposure to irradiation.

The use of photopolymerization enabled complex hierarchical nanostructures to form on a single substrate by locally controlling the irradition of the films. Photomasks, as shown in FIG. 5A, were able to modulate the UV intensity in controlled regions during photopolymeriation. FIG. 5B shows the surface morphology of the SIS film after in-film polymerization with the use of photomask. The exposed region went through a phase transition from cylinders to lamellae, while the unexposed area retained its cylindrial mesostructures. This result demonstrates that this methodology was able to generate complicated, hierarchical nanopatterns from one BCP on one substrate by simply controlling where the reaction took place.

Materials. Polystyrene-block-polyisoprene-block-polystyrene (SIS) copolymer (Kraton D1164P and Kraton D1113P) was obtained from Kraton Polymers, which contains 29 vol % polystyrene and 16% polystyrene, respectively. The nomenclature for these copolymers is SIS-x, in which x represents their polystyrene content. Toluene (ACS grade), styrene (ACS grade), isoprene (ACS grade), methyl methacrylate, 4-vinyl pyridine, anisole and diphenyl(2,4,6-trimethylbenzoyl)phosphine oxide (97%) were purchased from Sigma-Aldrich and used as received. The silicon wafers were obtained from University Wafer and used as substrates.

Thin film preparation and processing. The silicon wafers were first cleaned with Piranha solution ($H_2O_2$:$H_2SO_4$=3:7 vol: vol) at 95° C. for 2 h, rinsed with deionized water and dried with condensed air prior to use. SIS-16, and SIS-29 were dissolved in toluene at 2 wt. % concentration. The photoinitiator (diphenyl(2,4,6-trimethylbenzoyl)phosphine oxide) was dissolved in toluene (2 wt. %), and then both solutions were combined with 2.4 wt. % of photoinitiator relative to the BCP content. All the polymeric films that were spun cast from the above photoinitiator containing solutions spun at 800 rpm for the first 9 s and then at 3500 rpm for 45 s.

For the in-film photopolymerization process, common solvent vapor annealing (SVA) setups were adapted and $N_2$ (purity>99.99%) was used as a feeding gas. The samples were placed in the chamber with a quartz top (for UV-transmitting purpose) with a controllable monomer vapor flow rate, and its concentration was regulated using mass flow controllers. The films were first exposed to monomer vapor and $N_2$ (flow rate: 100 sccm) for 90 min to remove the oxygen from the liquid reservoir, sample chamber, and polymer thin films. The UV lamp (Black-Ray, High intensity UV lamp) was then turned on in order to irradiate the photoinitiator. The power intensity of the BCP film was approximately 0.5 mW/cm², as measured by a UV power reader. The in-film photopolymerization proceeded with exposure to the UV (5 min to 800 min) until removal of the UV power and solvent in the samples by neat $N_2$ at 50 sccm for 1 h.

Example 2: In-Film Photopolymerization of Polyisoprene and Polystyrene in Various BCPs This example builds on the work presented in Example 1 by illustrating the photopolymerization of polystyrene in an SIS BCP, as well as the affects of monomer vapor concentration, the styrene content of the BCP, and UV radiation intensity on film morphology. In addition, the photopolymerization of a PMMA homopolymer in a PS-b-PMMA BCP and the photopolymerization of a P4VP homopolymer in a PS-P4VP BCP are demonstrated.

Figure 6:
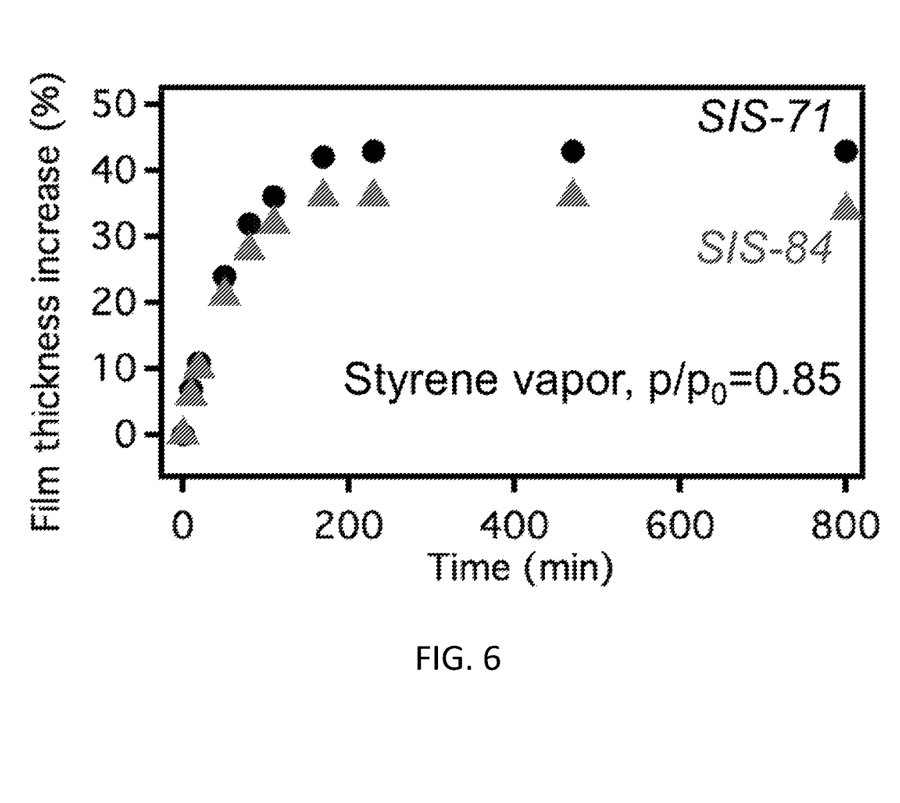
FIG. 6 is a graph showing an increase in the film thicknesses of SIS-71 and SIS-84 BCPs, relative to an initial unswollen film, as a function of photopolymerization time under a styrene monomer vapor with a concentration of $p/p_0=0.85$ and a UV power intensity of 0.5 mW/cm$^2$. Each data point represents a separate experiment, wherein a film of initial thickness 155±5 nm underwent polymerization for the denoted reaction time. p is the partial pressure of the monomer and $p_0$ is the monomer vapor pressure at room temperature.
Figure 7:
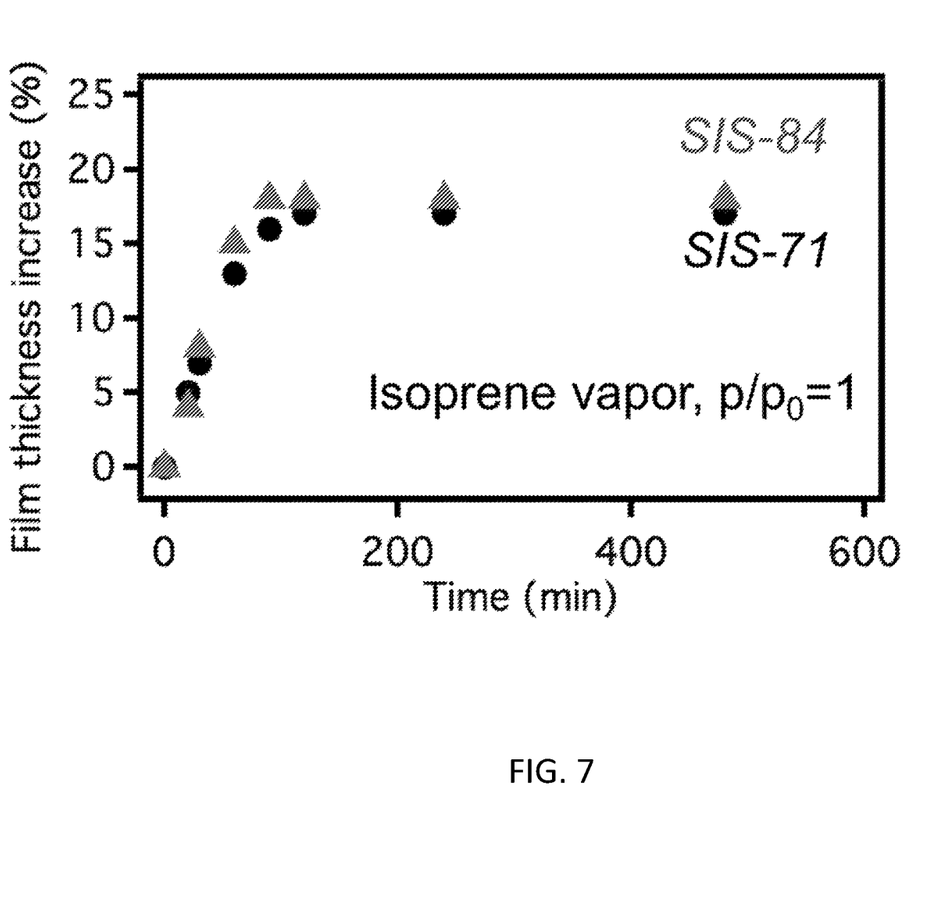
FIG. 7 is a graph showing an increase in the film thicknesses of SIS-71 and SIS-84 BCPs, relative to an initial unswollen film, as a function of photopolymerization time under an isoprene monomer vapor with a concentration of $p/p_0=1$ and a UV power intensity of 0.5 mW/cm$^2$. Each data point represents a separate experiment, wherein a film of initial thickness 155±5 nm underwent polymerization for the denoted reaction time. p is the partial pressure of the monomer and $p_0$ is the monomer vapor pressure at room temperature.

This method is demonstrated using a polystyrene-b-polyisoprene-b-polystyrene triblock, denoted as SIS-x, where x represents the percent polyisoprene volume fraction in the BCP, with 2.4 wt. % diphenyl(2,4,6-trimethylbenzoyl)phosphine oxide photoinitiator dissolved in the film. The three steps of the in-film photopolymerization can be clearly revealed by mass changes of the thin film, determined by quartz crystal microbalance (QCM) as shown in FIG. 1A (lower panel). The SIS-71 ($M_n$=124 kg/mol) film reached its equilibrium degree of swelling (40 wt. %) after 90 min. Upon UV irradiation at 365 nm, the monomers in the swollen SIS films were converted to homopolymers in situ, leading to an increase in mass with polymerization time, with further monomer vapor uptake in the film. After the reaction was terminated, the residual monomer in the film was completely removed after 20 min by purging dry $N_2$. The molar ratio of monomer to initiator could thus be estimated from the degree of swelling of the monomer vapor. As shown in FIG. 6, the thickness of the SIS-71 film increased 8% after irradiation for 10 min and eventually reached a plateau at a 42% increase after 170 min when the reaction terminated. SIS-84 ($M_n$=110 kg/mol) (see Example 1) exhibited a similar trend, with a slightly lower maximum thickness change of 36%. This thickness growth and mass increase reflected the amount of homopolymer synthesized in the SIS films through in-film polymerization. Similarly, isoprene can be polymerized in both SIS-71 and SIS-84 films, resulting in thickness increases to maxima of 16% and 17% after 120 min, respectively (FIG. 7). These results show that the synthesis of homopolymers in the swollen film can be achieved with different monomer selection, and the difference in the reaction kinetics of isoprene and styrene indicates their different reactivities within the SIS thin film.

Notably, this in-film photopolymerization technique differs from conventional initiated chemical vapor deposition (iCVD) processes, even though both involve polymerization of monomers introduced in the vapor phase. In iCVD, the initiation and polymerization occur in the vapor phase and subsequently deposit only at the gas-solid interface, where the deposition rate of polymer coatings on the substrate is highly dependent on the surface monomer concentration. In this method, the BCP acts as a nanoscale reactor containing initiator and monomer in the film, and polymerization can occur throughout the entire swollen film until all the radicals are consumed.

Figure 8A:
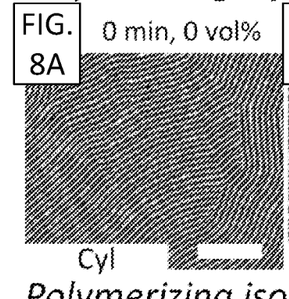
Figure 8B:
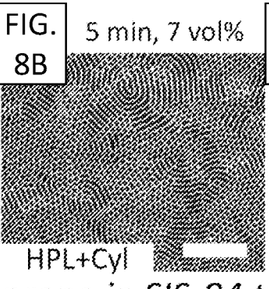
Figure 8C:
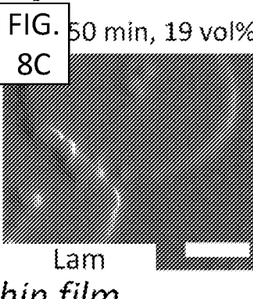
Figure 8D:
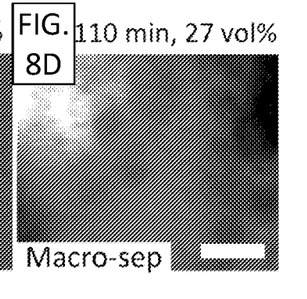
Figure 8E:
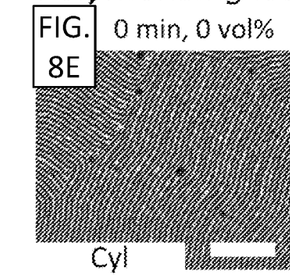
Figure 8F:
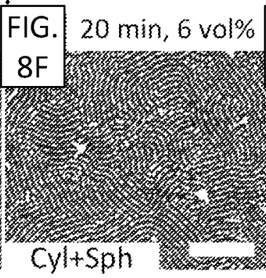
Figure 8G:
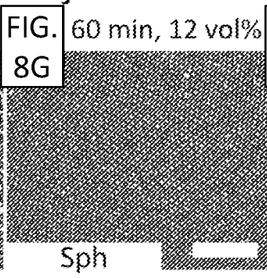
Figure 8H:
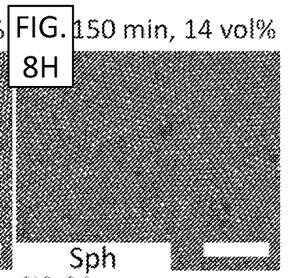

After annealing in styrene vapor, common fingerprint patterns from parallel cylinders were formed in SIS-71 prior to UV irradiation (FIG. 8A). With 7 vol % homo-PS added through photopolymerization, a majority of the film changed to a structure consistent with hexagonally perforated lamellae (HPL). The dark regions in the AFM phase images corresponded to domains with lower mechanical modulus, and were thus assigned to the polyisoprene domains. Further increasing the amount of homo-PS to 19 vol % led to characteristic 'island and hole' patterns with step sizes of approximately one domain spacing (~38 nm) associated with a lamellar morphology (FIG. 8C). Macrophase separation occurred when the homopolymer amount exceeded 27%, as shown in FIG. 8D by the presence of large dark domains, hundreds of nanometers in size. The polymerization of isoprene (up to 14 vol % addition) inside SIS-71 did not lead to any morphological transition, with all films exhibiting cylindrical styrene domains in an isoprene matrix. SIS-84 (see Example 1) is also a cylinder-forming BCP and, with the addition of polystyrene, maintained its cylindrical morphology. However, the polymerization of isoprene triggered a transition from cylinders (FIG. 8E) to spheres (FIGS. 8F and 8G). After photopolymerization for 20 min, the surface morphology contained a few regions of local hexagonally-packed spheres (FIG. 8F). Further increasing the photopolymerization time to 60 min, the entire morphology was converted to spheres, as indicated by the dot patterns that spanned the full area. Thermal annealing of films after photopolymerization with lamellae (FIG. 8C) and sphere (FIG. 8H) patterns at 140° C. for 24 h did not lead to any structural changes, indicating this morphological transition was thermodynamically favored by the change of the underlying polymer composition. Solvent (toluene) vapor annealing was also performed on SIS films with simultaneous UV irradiation. The lack of structural changes in this control experiment suggests that UV damage does not affect nanostructural rearrangement from in-film polymerization, which only occurs in the presence of both monomer vapor and UV.

Figure 8I:
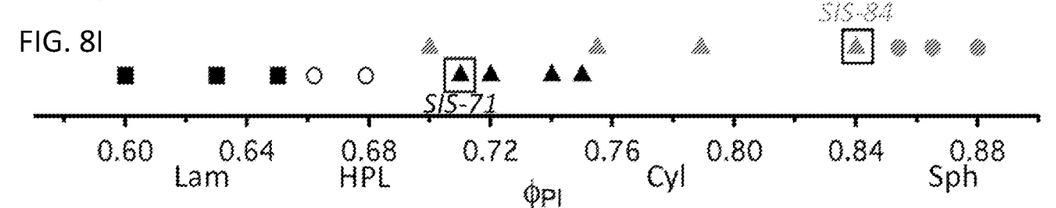
FIG. 8I shows the BCP nanostructures as a function of the total polyisoprene content (in the BCP+synthesized) of the film. The square boxes denote SIS-71 and SIS-84 prior to polymerization. The scale bar is 500 nm except in (c), where it is 6 µm.

The changes in the surface patterns from cylinders to spheres/lamellae with increasing UV irradiation time arose from changes in the underlying polymer composition. During and after in-film photopolymerization, the synthesized homopolymers selectively swelled the block with similar chemistry and increased its effective volume fraction. The estimated $_{102}N$ of SIS during its swollen state (>100, without homopolymers) was above the order-disorder transition for this composition ($_{102}N \approx 20$-30), so these films remained ordered, with sufficient chain mobility to allow an order-to-order transition. The co-existing morphologies in FIGS. 8B and 8F may have resulted from kinetic trapping from solvent removal during this transition. The phase behavior was further examined by determining the film composition after polymerization. The total volume fraction of polyisoprene (PI) in the film was given by $\phi_i(1-\phi_h)+\phi_h$ (for PI addition) or $\phi_i(1-\phi_h)$ (for PS addition), where $\phi_i$ is the original BCP isoprene content, and $\phi_h$ is the volume fraction of in-film synthesized homopolymers. As summarized in FIG. 8I, a variety of nanostructures can be obtained from these two BCPs by adjusting the overall polyisoprene content using this in-film photopolymerization method.

Figure 9A:
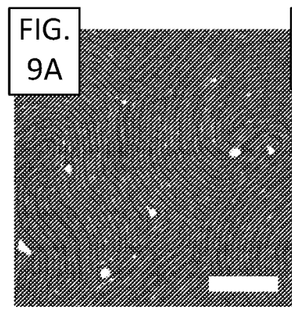
Figure 9B:
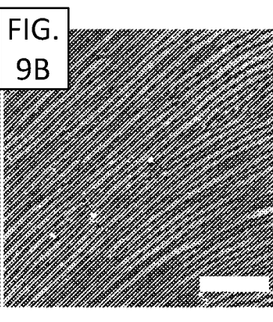
Figure 9C:
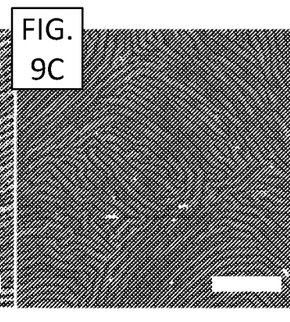
Figure 9D:
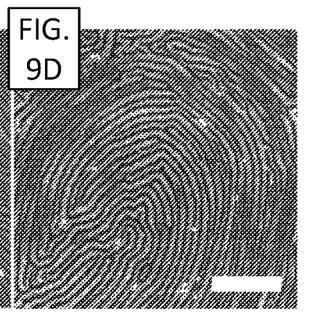
Figure 9E:
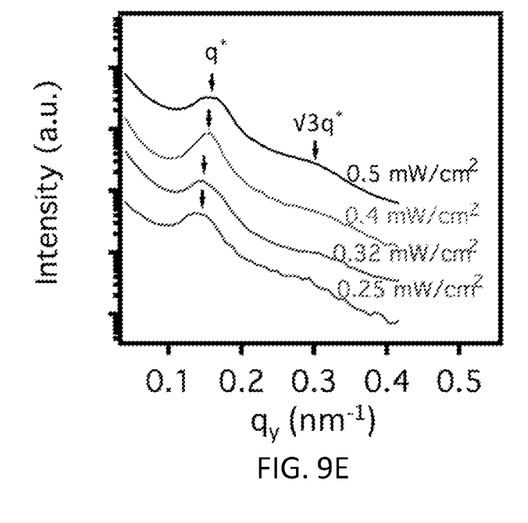
FIG. 9E shows the 1-D in-plane GISAXS profiles of the films.
Figure 9F:
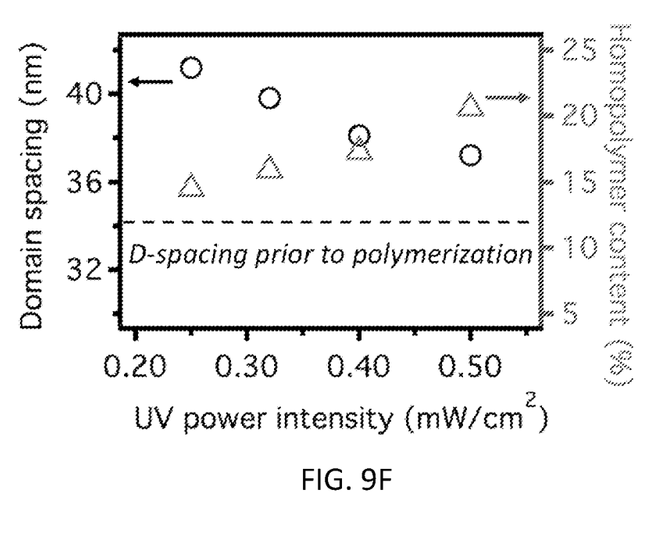
FIG. 9F shows the domain spacing and film thickness of the films after polymerization at various applied UV intensities. The initial domain spacing of SIS-84 prior to polymerization was 34.1 nm.

Blending homopolymers into block copolymer films also affects the domain spacing as the homopolymers expand the domain with similar chemistry. In a typical photopolymerization, the radical concentration monotonically increases with light intensity, which leads to faster reaction kinetics and a lower molecular weight (MW) of synthesized polymers. As shown in FIG. 9A-9F, identical photopolymerization conditions with lower UV intensity cause more expansion of PS domains (thicker bright regions) due to the addition of higher molecular weight PS. For a more quantitative understanding of the changes in domain spacing as a function of applied power intensity, grazing incidence small angle X-ray scattering (GISAXS) measurements were performed, and the results are shown as 1-D in-plane profiles in FIG. 9E. The film that was irradiated with 0.5 mW/cm² exhibited two diffraction peaks with a ratio of $q/q^*=1:\sqrt{3}$, consistent with the 2-D hexagonal cylindrical morphologies from the AFM image (FIG. 9A). Decreasing the UV intensity led to a broadening of the secondary ordering peak and a shift of the primary ordering peak toward a lower q. The average in-plane domain spacing of these samples is shown in FIG. 9F, which shows an increase from 37.2 nm for samples irradiated with 0.5 mW/cm² intensity to 41.2 nm at 0.25 mW/cm², even though the amount of polymerized PS in the film decreased because of the slower reaction kinetics.

Figure 10A:
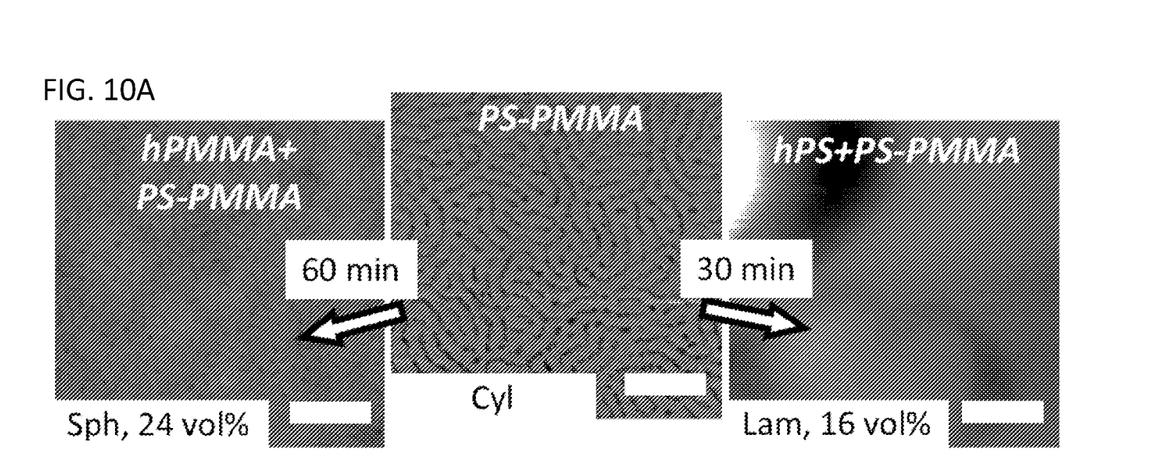
FIGS. 10A-10B show AFM micrographs of (10A) PS-b-PMMA annealed in the presence of a styrene monomer vapor, after in-film photopolymerization of the MMA monomer for 60 min and the styrene monomer for 30 min. The initial film thickness was 123 nm, and the scale bar is 500 nm. (10B) PS-b-P4VP annealed in styrene vapor, after in-film photopolymerization of 4 VP vapor for 60 min and styrene vapor for 30 min. The initial film thickness was 149 nm, and the scale bar is 250 nm. All reactions were performed with vapor concentrations at $p/p_0=0.85$, with UV intensity of 0.5 mW/cm$^2$.
Figure 10B:
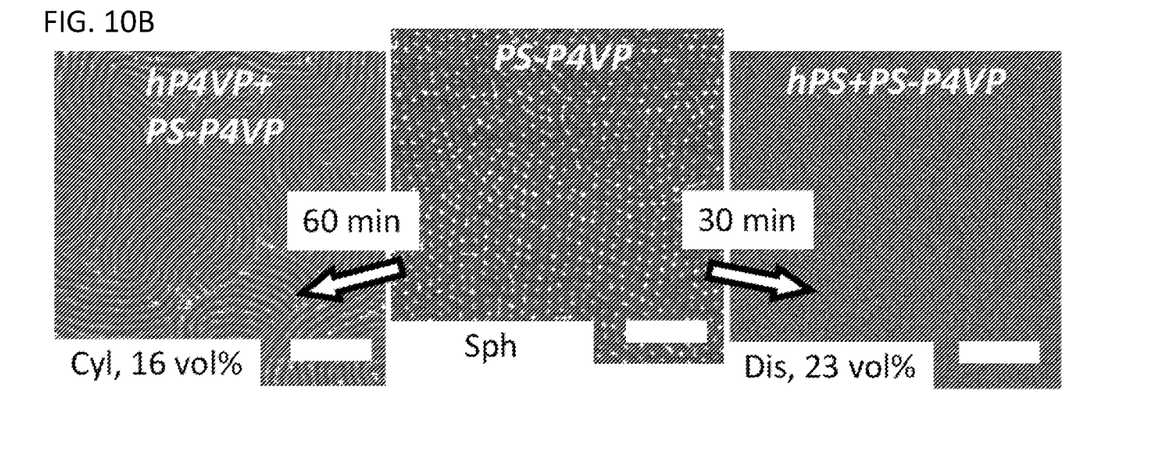

This strategy can be further extended to other BCP chemistries and different selections of radical-polymerizable monomer vapors. For example, a polystyrene-b-poly(methyl methacrylate) (PS-b-PMMA, $M_n$=52-142 kg/mol, $\phi_{PS}$=27%) assembled into PS cylinders within PMMA matrix, as shown in FIG. 10A. After swelling with MMA vapor ($p/p_0$=0.85) with simultaneous exposure to UV for 1 h, the film contained approximately 24 vol % homo-PMMA, leading to a total $\phi_{PS}$ of 20 vol % in blends. The new surface morphology comprised dark dots, indicating a phase transition from cylinders to spheres. Alternatively, lamellar nanostructures can be obtained by polymerizing the styrene monomer to a homo-PS content of 18 vol % with UV irradiation for 30 min. Polymerization of 4-vinyl pyridine for 30 min within a sphere-forming polystyrene-b-poly(4-vinylpyridine) (PS-b-P4VP, $M_n$=21-4 kg/mol, $\phi_{PS}$=85%) film resulted in 16 vol % homo-P4VP. The resulting total P4VP content was 28 vol %, leading to a cylindrical morphology (FIG. 10B). On the other hand, adding approximately 30 vol % PS by photopolymerization resulted in a disordered BCP with a homogeneous top surface. These results demonstrate that this technique is universal and generalizable for in-film tuning of nanostructures with a variety of BCP systems and monomers.

Figure 11A:
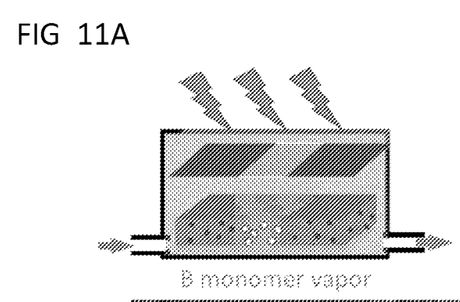
FIGS. 11A-11F show: (11A) a schematic illustration of in-film photopolymerization using a photomask for local control of the polymerization reaction. (11B) and (11C) are false-color images of an SIS-71 film and an SIS-84 film, respectively, from optical interference profilometry after polymerization for 30 min in the presence of styrene vapor or isoprene vapor at $p/p_0=0.75$, reproducing the patterns from the photomask shown in the inset. The scale bar is 15 μm. Micrographs of (11D) SIS-71 film (scale bar: 1.5 μm) and (11E) SIS-84 (scale bar: 750 nm) after photopolymerization with photomasks. Image (11D) is stitched from two AFM phase images. These images correspond to the highlighted areas in (11B) and (11C). (11F) AFM phase image of SIS-84 film (scale bar: 750 nm) after photopolymerization and shear alignment with the inset FFT of the micrograph.
Figure 11B:
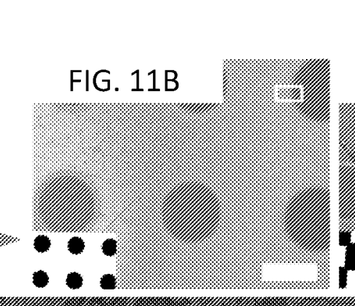
Figure 11C:
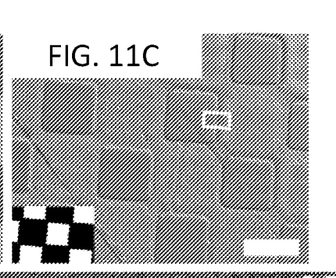
Figure 11D:
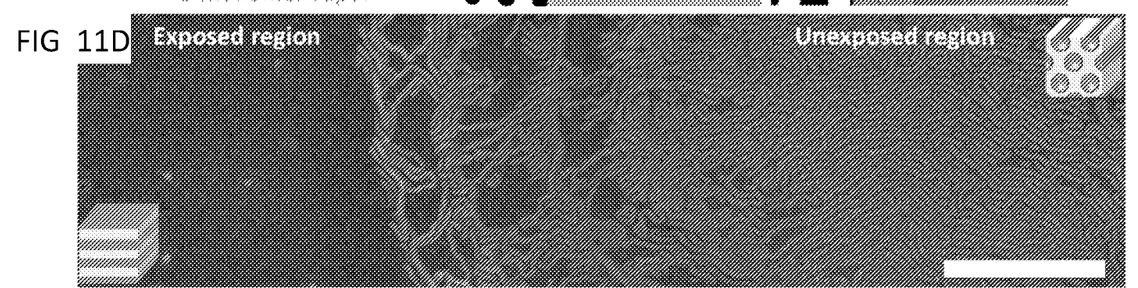
Figure 11E:
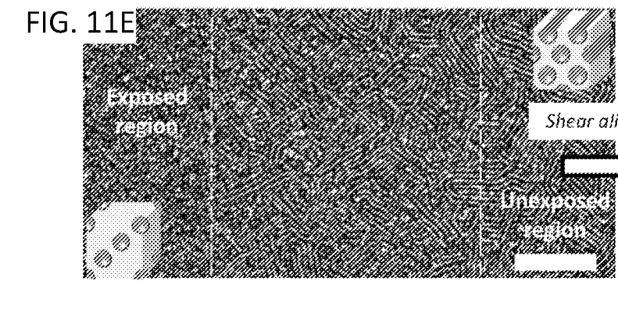

The use of photoinitiators as radical generators enabled local control of polymerization on the BCP films. As in Example 1, photomasks were used to modulate the selective exposure of the films to UV light in certain regions where polymerization occurs, while unexposed areas retained their original morphologies (FIG. 11A). The ability to localize the polymerization in self-assembled films with high spatial fidelity was demonstrated by reproducing geometrical patterns from a photomask to BCP thin films, as shown in FIGS. 11B and 11C. UV irradiation led to an increase in thickness and a modification of the morphology through in-film synthesis of homopolymers in the exposed areas. FIG. 11D shows the surface morphology of an SIS-71 film after in-film photopolymerization of a styrene monomer with dark circular areas on a photomask, resulting in the original cylindrical morphology in the circular unexposed areas and featureless lamellar structures in the surrounding exposed areas. The circular boundary between these two BCP morphologies shows that this method provided accurate registration of photopolymerization in the film. Co-existence of BCP cylinders and lamellae observed in the interface between the modified and native morphologies can be attributed to 1) optical resolution limitations from diffraction; 2) local lateral diffusion of synthesized homopolymer chains in the swollen film; and 3) surface energy driven flow from the thicker exposed region to the unexposed region during polymerization. Photopolymerization of isoprene monomers in an SIS-84 film led to a local morphological transition from cylinders to spheres, as shown in FIG. 11E, which comprises the original cylinders in the unexposed region to the final spherical nanostructure in the exposed region.

Figure 11F:
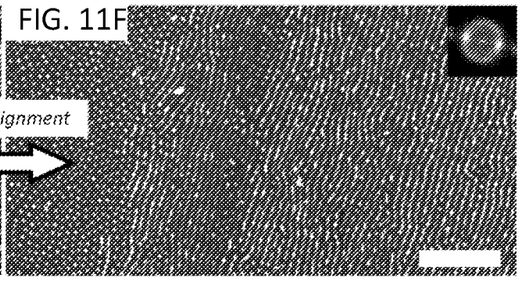

The morphological changes from this photopolymerization method were guided by the underlying chemistry of the BCPs, so the altered nanostructures were thermodynamically favored. Thus, this method can be combined with other directed self-assembly techniques such as pre-patterned substrates (chemo- or graphoepitaxy) or post-annealing processes for improving the BCP ordering or controlling the nanodomain orientation. Here, the advantage of this method was demonstrated by post shear alignment of the in-film polymerized SIS-84 film (FIG. 11E). Upon solvent vapor annealing with shear (SVA-S), the two distinct nanodomains (cylinders and spheres) were still retained, as shown in FIG. 11F. The ordering of spherical nanostructures was improved, while the alignment of the cylinders was confirmed by the FFT (inset of FIG. 11F). These results demonstrate the versatility of this in-film photopolymerization process for generating hierarchical nanopatterns from one BCP film matrix by locally altering the underlying polymer chemistry and composition, as well as in combination with other techniques for nanostructure orientation control or ordering improvement.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a polymer film, the method comprising:
   exposing a polymer film comprising a first polymer to a vapor comprising polymerizable monomers, wherein the first polymer is a block copolymer that is assembled into at least two domains in the polymer film and the polymerizable monomers diffuse into, and swell, the polymer film; and
   polymerizing the polymerizable monomers into a second polymer within the polymer film.

2. A method of forming a polymer film, the method comprising:
   exposing a polymer film comprising a first polymer and having a radical initiator embedded therein to a vapor comprising polymerizable monomers, wherein the polymerizable monomers diffuse into, and swell, the polymer film; and
   polymerizing the polymerizable monomers into a second polymer within the polymer film by exposing the polymer film to a stimulus that activates the embedded radical initiator, inducing the polymerization of the polymerizable monomers.

3. A method of forming a polymer film, the method comprising:
   exposing a polymer film comprising a first polymer to a vapor comprising polymerizable monomers, wherein the polymerizable monomers diffuse into, and swell, the polymer film;
   exposing the polymer film to a vapor comprising a radical initiator, wherein the radical initiator diffuses into the polymer film;
   and
   polymerizing the polymerizable monomers into a second polymer within the polymer film by exposing the polymer film to a stimulus that activates the radical initiator, inducing the polymerization of the polymerizable monomers.

4. The method of claim 1, wherein the polymerization of the second polymer within the polymer film changes the shapes of the at least two domains.

5. The method of claim 1, wherein the polymerization of the second polymer within the polymer film changes the sizes of one or both of the at least two domains.

6. The method of claim 1, wherein the polymerizable monomers are all a single type of polymerizable monomer and the second polymer is a homopolymer of the polymerizable monomers.

7. The method of claim 1, wherein the vapor comprises two or more types of polymerizable monomers and the second polymer is a copolymer of the two or more types of polymerizable monomers.

8. The method of claim 1, wherein the polymerizable monomers are all a single type of polymerizable monomer and the second polymer is a homopolymer of the polymerizable monomers.

9. The method of claim 4, wherein the block copolymer comprises a first block that is polymerized from a first monomer and a second block that is polymerized from a second monomer and the polymerizable monomers comprise the first monomer, the second monomer, or a mixture thereof.

10. The method of claim 9, wherein the block copolymer is a polystyrene-polyisoprene-polystyrene block copolymer and the polymerizable monomers comprise styrene monomers, isoprene monomers, or a mixture thereof.

11. The method of claim 9, wherein the block copolymer is a polystyrene-poly(methyl methacrylate) block copolymer and the polymerizable monomers comprise methyl methacrylate monomers, styrene monomers, or a mixture thereof.

12. The method of claim 9, wherein the block copolymer is a polystyrene-poly(vinyl pyridine) block copolymer and polymerizable monomers comprise vinyl pyridine monomers, styrene monomers, or a mixture thereof.

13. The method of claim 4, wherein the at least two domains of the block copolymer comprise cylindrical domains prior to the polymerization of the polymerizable monomers into the second polymer and comprise lamellar domains or spherical domains after the polymerization of the polymerizable monomers into the second polymer.

14. The method of claim 10, wherein the at least two domains of the block copolymer comprise cylindrical domains prior to the polymerization of the polymerizable monomers into the second polymer and comprise lamellar domains or spherical domains after the polymerization of the polymerizable monomers into the second polymer.

15. The method of claim 11, wherein the at least two domains of the block copolymer comprise cylindrical domains prior to the polymerization of the polymerizable monomers into the second polymer and comprise lamellar domains or spherical domains after the polymerization of the polymerizable monomers into the second polymer.

16. The method of claim 4, wherein the at least two domains of the block copolymer comprise spherical domains prior to the polymerization of the polymerizable monomers into the second polymer and comprise lamellar domains after the polymerization of the polymerizable monomers into the second polymer.

17. The method of claim 12, wherein the at least two domains of the block copolymer comprise spherical domains prior to the polymerization of the polymerizable monomers into the second polymer and comprise lamellar domains after the polymerization of the polymerizable monomers into the second polymer.

18. The method of claim 2, wherein only a portion of the polymer film is exposed to the stimulus, such that the second polymer is polymerized only in the portion of the polymer film that is exposed.

19. The method of claim 3, wherein only a portion of the polymer film is exposed to the stimulus, such that the second polymer is polymerized only in the portion of the polymer film that is exposed.

20. The method of claim 4, wherein only a portion of the polymer film is exposed to the stimulus, such that the second polymer is polymerized only in the portion of the polymer film that is exposed, resulting in a polymer film having a first portion with a first domain morphology and a second portion with a second domain morphology, wherein the first domain morphology differs from the second domain morphology.

21. The method of claim 2, wherein the stimulus comprises ultraviolet radiation.

22. The method of claim 3, wherein the stimulus comprises ultraviolet radiation.

* * * * *